United States Patent
Akamatsu et al.

(10) Patent No.: US 8,730,742 B2
(45) Date of Patent: May 20, 2014

(54) DEVICE

(76) Inventors: Hiroshi Akamatsu, Tokyo (JP); Shoji Kaneko, Tokyo (JP)

(*) Notice: Subject to any disclaimer, the term of this patent is extended or adjusted under 35 U.S.C. 154(b) by 94 days.

(21) Appl. No.: 13/443,810

(22) Filed: Apr. 10, 2012

(65) Prior Publication Data

US 2012/0262996 A1  Oct. 18, 2012

(30) Foreign Application Priority Data

Apr. 14, 2011 (JP) ................................ 2011-090325

(51) Int. Cl.
| | |
|---|---|
| *G11C 7/00* | (2006.01) |
| *G11C 7/10* | (2006.01) |
| *G11C 7/12* | (2006.01) |
| *G11C 7/22* | (2006.01) |
| *G11C 5/14* | (2006.01) |

(52) U.S. Cl.
CPC .. *G11C 7/10* (2013.01); *G11C 7/12* (2013.01); *G11C 7/22* (2013.01); *G11C 5/147* (2013.01)
USPC ..................................... 365/189.05; 365/201

(58) Field of Classification Search
CPC ............ G11C 7/00; G11C 7/10; G11C 5/147; G11C 7/12; G11C 7/22
USPC ............................................. 365/189.05, 201
See application file for complete search history.

(56) References Cited

U.S. PATENT DOCUMENTS

| 6,141,278 A | 10/2000 | Nagase | |
|---|---|---|---|
| 2003/0185074 A1* | 10/2003 | Nakamura | ..................... 365/201 |
| 2004/0105327 A1* | 6/2004 | Tanno | ............................ 365/200 |

FOREIGN PATENT DOCUMENTS

JP          8-227598 A      9/1996

* cited by examiner

*Primary Examiner* — Ly D Pham
(74) *Attorney, Agent, or Firm* — McGinn IP Law Group, PLLC

(57) ABSTRACT

Provided is a device, including: a first terminal which receives an external clock signal; a clock generation circuit connected to the first terminal to generate an internal clock signal based on the external clock signal; word lines and bit lines; amplifier circuits connected to the bit lines, respectively; and a control unit. The control unit controls, in a test operation, at least one of the word lines to repeat a selected state and an unselected state in accordance with the internal clock signal during a first period, and maintains the amplifier circuits in an active state during the first period. The control unit further controls, in a normal operation, the amplifier circuits to switch between the active state and an inactive state depending on switching between the selected state and the unselected state of the at least one of the word lines.

11 Claims, 7 Drawing Sheets

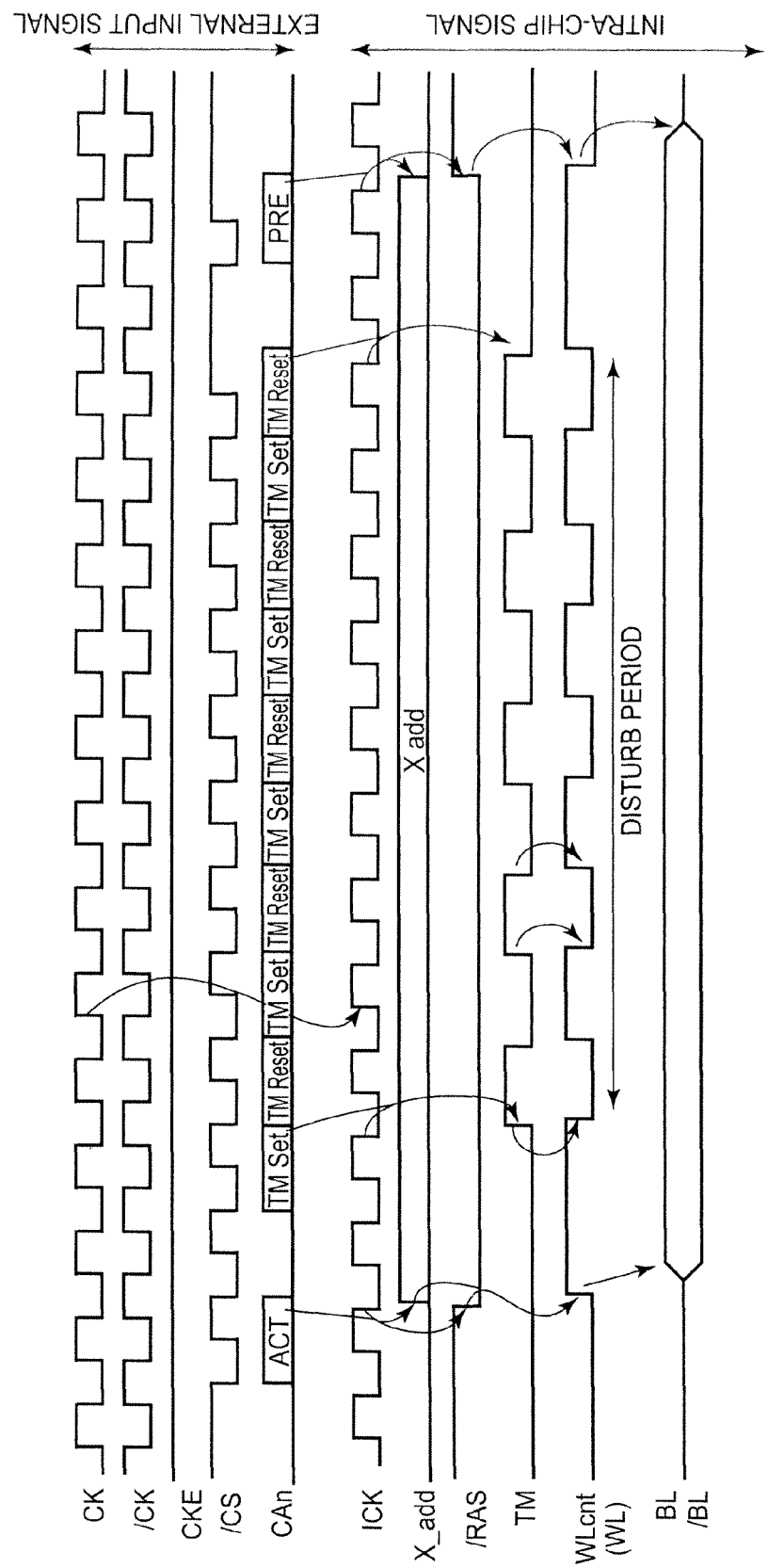

DEVICE

This application claims priority to prior application JP 2011-90325, the disclosure of which is incorporated herein by reference.

BACKGROUND OF THE INVENTION

1. Field of the Invention

This invention relates to a semiconductor device, and more specifically, to a semiconductor storage device including a plurality of memory cells.

2. Description of the Related Art

A semiconductor storage device such as a dynamic random access memory (DRAM) includes a plurality of memory cells arranged so as to correspond to intersections between a plurality of word lines and a plurality of bit lines. The memory cells may be accessed for each row by selectively activating one corresponding word line. Further, an access for each memory cell may be controlled by a combination of a word line and a bit line.

However, as a result of a progress in reducing the size and increasing the integration of semiconductor devices, a potential change in each word line now affects other surrounding word lines. In other words, due to the parasitic capacitance and other such effects, when a word line is selectively activated, momentary electric potential change to other word lines now occurs. As a result, there now occurs a phenomenon that electric charges held in a memory cell connected to a different word line than the activated word line flow out to a bit line. Such outflow of the electric charges may cause loss of data written in the memory cell. Therefore, there has conventionally been conducted an electrical test called "disturb test" for examining whether such outflow of electric charges is equal to or less than a permissible value.

The disturb test involves performing an operation of sequentially selecting a plurality of word lines or an operation of repetitively selecting one or a plurality of word lines. A related semiconductor storage device is configured so that, in order to perform such operation of selecting the word lines at high speed, an internal row address strobe (RAS) signal φRAS is generated in synchronization with a clock signal generated in an internal period setting circuit, and so that a RAS-system control circuit is operated in accordance with the internal RAS signal φRAS. Examples of such semiconductor storage device include a semiconductor storage device described in Japanese Unexamined Patent Application Publication (JP-A) No. 8-227598.

SUMMARY

As described above, in the related semiconductor storage device, the internal RAS signal φRAS, which is in synchronization with the clock signal generated in the internal period setting circuit, is supplied to the RAS-system control circuit. As a result, the test may be performed at high speed regardless of the performance or the like of an external test device.

However, the RAS-system control circuit is a circuit for controlling not only a row decoder but also a sense amplifier circuit and a bit-line equalizing/precharging circuit. That is, the related semiconductor storage device executes, in the disturb test, the operation of selecting the word lines as well as switching between an active state and an inactive state of the sense amplifier circuit and driving of the bit-line equalizing/precharging circuit. In other words, the related semiconductor storage device performs operations similar to normal read and write operations even during the disturb test. Therefore, the related semiconductor storage device has a problem in that power consumption in the disturb test is large. The large power consumption in the disturb test may cause a damage to the test device, a test jig, and internal wiring (intra-chip wiring) of the semiconductor device.

This invention seeks to solve one or more of the above problems, or to improve upon those problems at least in part.

In one embodiment, there is provided a device that includes a terminal which receives an external clock signal, a clock generation circuit which is connected to the first terminal and which generates an internal clock signal based on the external clock signal, a plurality of word lines and a plurality of bit lines, a plurality of amplifier circuits which are connected to the plurality of bit lines, respectively, and a control unit. The control unit controls, in a test operation, at least one word line of the plurality of word lines to repeat a selected state and an unselected state in accordance with the internal clock signal during a first period and maintains the plurality of amplifier circuits in an active state during the first period. The control unit controls, in a normal operation, the plurality of amplifier circuits to switch between the active state and an inactive state depending on switching between the selected state and the unselected state of the at least one word line of the plurality of word lines.

In another embodiment, there is provided a device that includes a memory cell array which includes a plurality of word lines and a plurality of bit lines; an amplifier unit connected to the plurality of bit lines; and a control unit which performs selection control of the plurality of word lines and activation control of the amplifier unit. The control unit causes, in a first period of a test operation, at least one word line of the plurality of word lines to be alternately changed to a selected state and an unselected state and maintains the amplifier unit to an active state.

BRIEF DESCRIPTION OF THE DRAWINGS

The above features and advantages of the present invention will be more apparent from the following description of certain preferred embodiments taken in conjunction with the accompanying drawings, in which:

FIG. 7 is a waveform diagram for describing an operation in a disturb test of the semiconductor device of FIG. 5.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
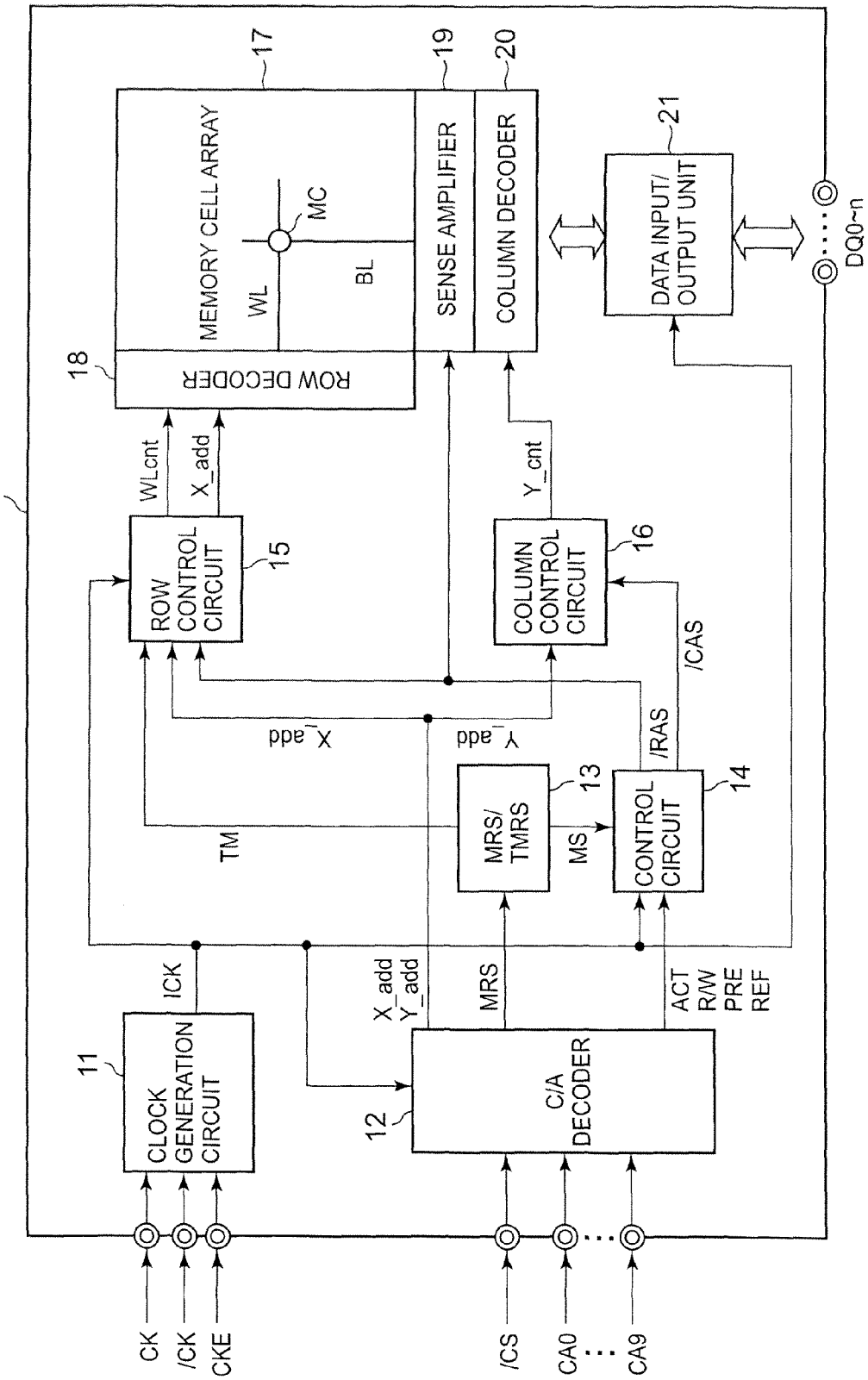
FIG. 1 is a block diagram illustrating a schematic configuration of a semiconductor device according to a first embodiment of this invention.

FIG. 1 is a block diagram illustrating a schematic configuration of a semiconductor device according to a first embodiment of this invention. Herein, a dynamic random access memory (DRAM) is intended as the semiconductor device, but this invention is not limited thereto.

A semiconductor device 10 illustrated in FIG. 1 includes a clock generation circuit 11, a command/address (C/A) decoder 12, a mode register/test mode register (MRS/TMRS) 13, a control circuit 14, a row control circuit 15, a column control circuit 16, a memory cell array 17, a row decoder 18, a sense amplifier (SA) 19, a column decoder 20, and a data input/output unit 21. The semiconductor device 10 further includes a plurality of clock terminals (CK,/CK, and CKE), a plurality of control signal terminals (/CS and CA0 to CA9), and a plurality of data terminals (DQ0 to DQn).

The clock generation circuit 11 generates, based on clock signals CK and /CK and a clock enable signal CKE, which are supplied from the outside through the clock terminals, an internal clock signal ICK to be used in circuits in the semiconductor device 10.

The C/A decoder 12 receives a chip select signal /CS and command/address signals CA0 to CA9 (in the following description, those signals are sometimes collectively referred to as "control signals"), which are supplied from the outside through the control signal terminals, and generates various internal control signals. The various internal control signals include an activation command ACT, a read/write command R/W, a precharge command PRE, an auto refresh command REF, a mode register set command MRS, internal address signals X_add (internal row address signal) and Y_add (internal column address signal), and the like.

The MRS/TMRS 13 generates, in response to the mode register set command MRS supplied from the C/A decoder 12, an operation mode signal MS and a test mode signal TM.

The control circuit 14 receives the internal control signal ACT, R/W, PRE, or REF, which is supplied from the C/A decoder 12, and the operation mode signal MS, which is supplied from the MRS/TMRS 13, and generates a row operation control signal /RAS and a column operation control signal /CAS.

The row control circuit 15 supplies, based on the internal row address signal X_add, the row operation control signal /RAS, and the test mode signal TM, a word line control signal WLcnt and the internal row address signal X_add to the row decoder 18. Note that, the row control circuit 15 operates, together with the MRS/TMRS 13 (especially the test mode register TMRS) and the control circuit 14, as a word-line selecting operation control unit for selecting a word line in a disturb test.

The column control circuit 16 receives the internal address signal Y_add and the column operation control signal /CAS and supplies a row decoder control signal Y_cnt including the row address Y_add to the column decoder 20.

The memory cell array 17 includes a plurality of word lines WL, a plurality of bit lines BL, and a plurality of memory cells MC arranged so as to correspond to intersections between the word lines and the bit lines. FIG. 1 illustrates one word line, one bit line, and one memory cell arranged so as to correspond to an intersection between the word line and the bit line.

The row decoder 18 selects, based on the word line control signal WLcnt and the internal row address signal X_add, a word line WL specified by the internal row address signal X_add from among the plurality of word lines and controls the selected word line WL.

The sense amplifier 19 includes a plurality of sense amplifier circuits (not shown), which are connected to the corresponding bit lines, respectively. The plurality of sense amplifier circuits are controlled to an active state or an inactive state depending on the row operation control signal /RAS supplied from the control circuit 14. In a normal operation, the plurality of sense amplifier circuits are activated when the word lines connected to the memory cells connected to the bit lines, to which the sense amplifier circuits are connected, respectively, are activated. The sense amplifier circuits in the active state amplify data read from the memory cells MC to the corresponding bit lines.

The column decoder 20 selectively connects, in response to the row decoder control signal Y_cnt, a sense amplifier circuit specified by the internal column address signal Y_add of the plurality of sense amplifier circuits to the data input/output unit 21.

The data input/output unit 21 outputs read data supplied from the sense amplifier circuits to the outside through the data terminals DQ. The data input/output unit 21 also supplies write data, which are supplied from the outside through the data terminals DQ, to the memory cell array 17 through the column decoder 20 and the sense amplifier 19.

Note that, in the above-mentioned configuration, the command/address signals CA0 to CA9 are input to the C/A decoder 12, but there may be provided a command decoder connected to command terminals to which command signals (including the chip select signal /CS) are input, and an address buffer connected to address terminals to which address signals are input. In this case, the command decoder generates the various internal control signals based on the command signals supplied through the command terminals, and the address buffer generates the internal address signals based on the address signals supplied through the address terminals.

Figure 2:
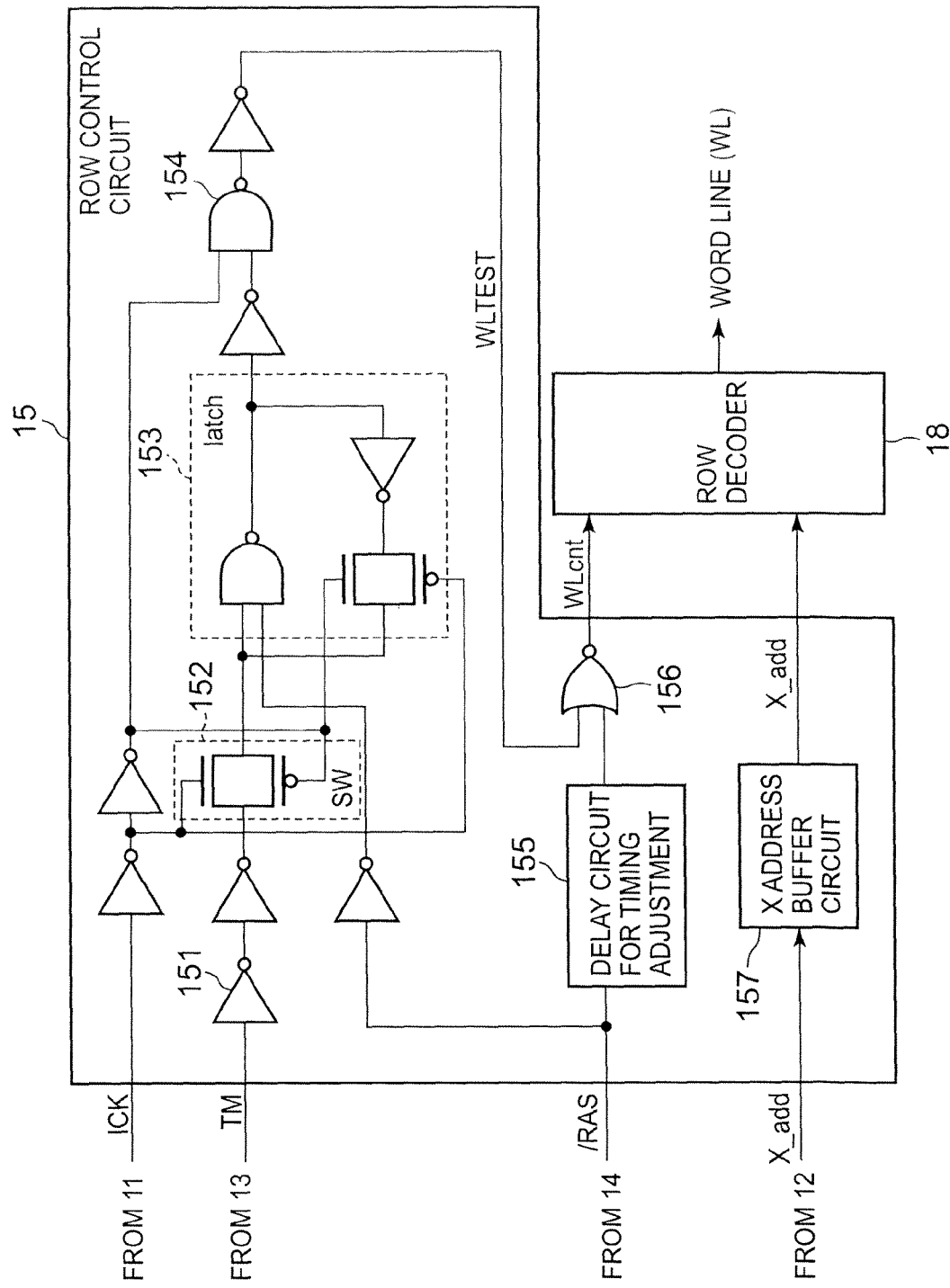
FIG. 2 is a circuit configuration diagram illustrating an internal schematic configuration of a row control circuit included in the semiconductor device of FIG. 1.

Next referring to FIG. 2, an internal configuration of the row control circuit 15 is described.

The row control circuit 15 includes a plurality of inverters 151, a switching circuit (SW) 152, a latch circuit (latch) 153, a NAND circuit 154, a delay circuit for timing adjustment 155, a NOR circuit 156, and an X address buffer circuit 157.

The inverters 151 perform signal timing adjustment and logical inversion of each signal.

The switching circuit 152 passes or blocks, based on the internal clock signal ICK from the clock generation circuit 11, the test mode signal TM from the MRS/TMRS 13.

The latch circuit 153 is enabled when the row operation control signal /RAS from the C/A decoder 12 is at an active level (low level), and latches the test mode signal TM from the switching circuit 152.

The NAND circuit 154 is enabled when the test mode signal TM latched by the latch circuit 153 is at the active level, and causes its output level alternate transitions to a high level and a low level in synchronization with the internal clock signal ICK.

The delay circuit for timing adjustment 155 delays the row operation control signal /RAS from the C/A decoder 12 by a predetermined time period and supplies the delayed row operation control signal /RAS to one input node of the NOR circuit 156.

The NOR circuit 156 is enabled by the row operation control signal /RAS, which has been adjusted in timing by the delay circuit for timing adjustment 155, and subjects a word line test signal WLTEST, which is obtained by subjecting the output of the NAND circuit 154 to logical inversion in the inverter, to further logical inversion for output as the word line control signal WLcnt to the row decoder 18.

The X address buffer circuit 157 temporarily holds the internal row address signal X_add from the C/A decoder 12 and outputs the held internal row address signal X_add to the row decoder 18 at a predetermined timing.

Hereinafter, the operation of the semiconductor device 10 of FIG. 1 is described referring also to FIGS. 2 to 4.

The disturb test includes a method of examining not only interference between the word lines but also interference between adjacent cells (hereinafter, referred to as first method) and a method of mainly examining the interference between the word lines without caring the interference between the adjacent cells (hereinafter, referred to as second method).

The first method involves performing processes of writing test data to cells connected to a word line WL under test, disturbing the word line WL under test, and reading the test data from the cells connected to the word line WL under test.

The second method involves performing processes of writing test data to every cell in an area under test, disturbing each of the word lines WL in the area under test, and reading the test data from the every cell in the area under test.

The first method and the second method are selectively used depending on the purpose, but the disturbance of one word line WL under test is the same operation in both methods.

Figure 3:
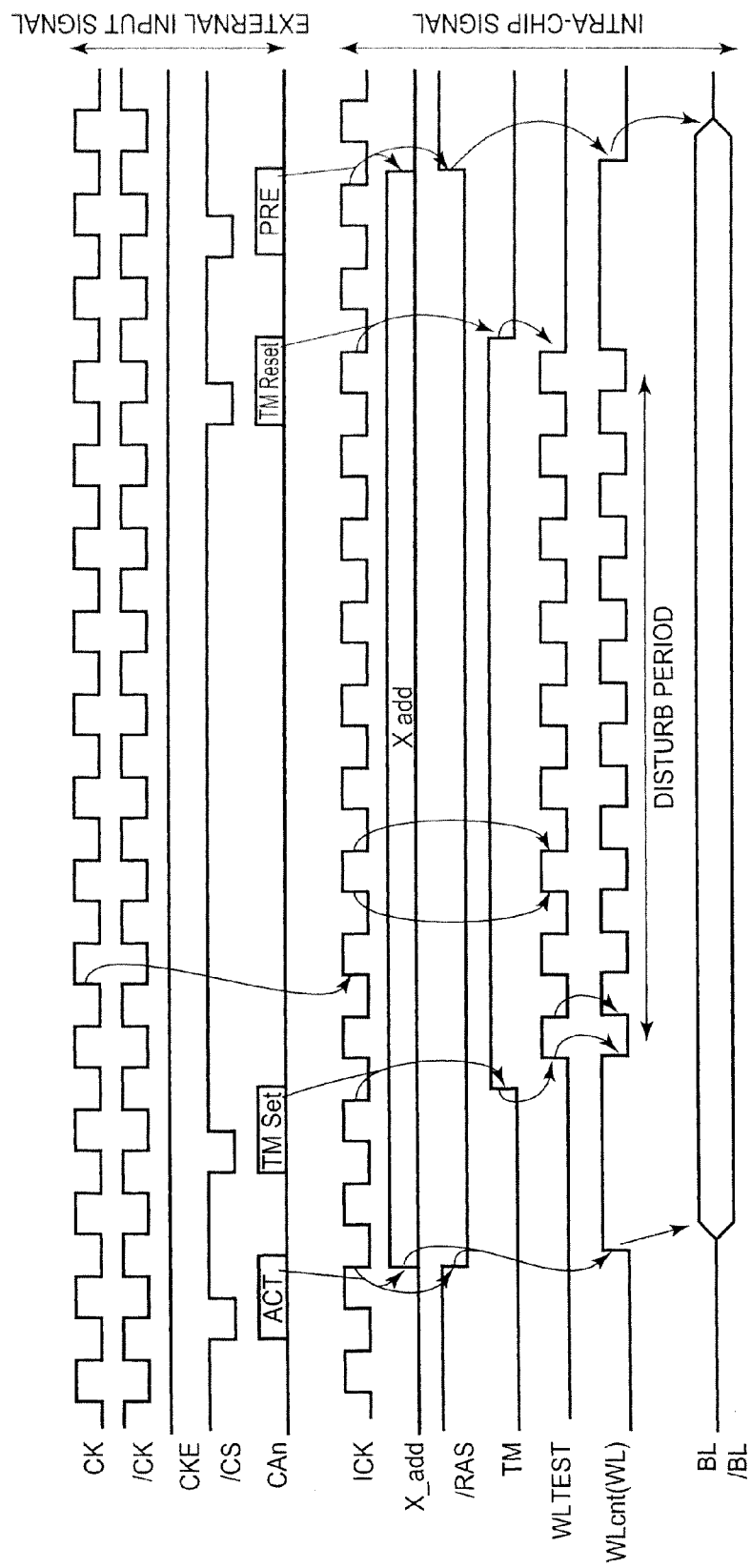
FIG. 3 is a waveform diagram for describing an operation in a disturb test of the semiconductor device of FIG. 1.

FIG. 3 illustrates signal waveforms of the components when one word line WL under test is disturbed. FIG. 3 illustrates waveforms of the signals input to the semiconductor device 10 from the outside in the upper part thereof and waveforms of the signals inside the semiconductor device (chip) in the lower part thereof. Note that, the writing and reading of the test data performed before and after the disturbance, respectively, are the same as in known methods and therefore description thereof is omitted.

The semiconductor device 10 operates in accordance with the clock signals CK,/CK, and CKE, the chip select signal/CS, and a command/address signal CAn, which are supplied from a test device (not shown).

The clock generation circuit 11 generates the internal clock signal ICK based on the clock signals CK and/CK and the clock enable signal CKE, which are supplied to the clock terminals from the outside.

Under the state in which the internal clock signal ICK is generated, the C/A decoder 12 outputs various commands and address signals in response to combinations of the chip select signal/CS and the command/address signal CAn, which are supplied to the control signal terminals from the outside.

When a combination of control signals representing the activation command ACT are supplied to the control signal terminals, the C/A decoder 12 outputs the activation command ACT to the control circuit 14. The C/A decoder 12 also supplies, based on the address signals supplied to the control signal terminals, the internal row address signal X_add for specifying a word line WL to be subjected to the disturb test to the X address buffer circuit 157 of the row control circuit 15.

The control circuit 14 causes, in response to the activation command ACT, the row operation control signal/RAS a transition from an inactive level (high level) to the active level (low level). The X address buffer circuit 157 holds the internal row address signal X_add.

The row control circuit 15 outputs, when the row operation control signal /RAS is at the active level, the internal row address signal X_add for specifying the word line to be selectively activated and the word line control signal WLcnt to the row decoder 18.

The row decoder 18 selectively drives, in response to the word line control signal WLcnt, the word line WL specified by the internal row address signal X_add from the inactive state (low level) to the active state (high level).

In addition, when the row operation control signal/RAS from the control circuit 14 is at the active level, of the plurality of sense amplifier circuits in the sense amplifier 19, a plurality of sense amplifier circuits connected to memory cells connected to the word line WL to be subjected to the disturb test are activated. As a result, potentials on the bit lines BL connected to the memory cells connected to the word line WL to be subjected to the disturb test and bit lines/BL paired with the bit lines BL are amplified. Thereafter, while the row operation control signal/RAS maintains the active level (low level), the plurality of activated sense amplifier circuits maintain the active state.

When a combination of control signals representing a test mode set code TM_Set are supplied to the control signal terminals, the C/A decoder 12 transfers the mode register set command MRS and the test mode set code TM_Set to the MRS/TMRS 13.

The MRS/TMRS 13 causes, in response to the mode register set command MRS and the test mode set code TM_Set, which are supplied from the C/A decoder 12, the test signal TM a transition from the inactive level (low level) to the active level (high level). Thereafter, the MRS/TMRS 13 maintains the test signal TM at the active level until a test mode reset command TM_Reset is supplied thereto.

The row control circuit 15 alternately changes, when the test signal TM is activated in the state in which the row operation control signal/RAS is activated, the word line control signal WLcnt to the low level and the high level based on the internal clock signal ICK. The word line control signal WLcnt is supplied to the row decoder 18 along with the internal row address signal X_add from the C/A decoder 12.

To be specific, in the row control circuit 15, the latch circuit 153 becomes a state to enable input (enabled state) in response to the active level of the row operation control signal/RAS. In addition, the switching circuit 152 becomes a conductive state in a period in which the internal clock signal ICK is at high level. At this time, when the test signal TM becomes the active level, the test signal TM at the active level is supplied to the latch circuit 153 through the switching circuit 152. Then, the latch circuit 153 latches (holds) the test signal TM at the active level.

When the test signal TM at the active level is held by the latch circuit 153, a high level signal is supplied to one input node of the NAND circuit 154. This causes the internal clock signal ICK supplied to the other input node of the latch circuit 153 to be inverted and output. This output is supplied as the word line test signal WLTEST to the one input node of the NOR circuit 156.

Input to the other input node of the NOR circuit 156 is the row operation control signal/RAS, which has been adjusted in timing by the delay circuit for timing adjustment 155. In a period in which the row operation control signal/RAS is at the active level, the NOR circuit 156 sets the word line control signal WLcnt to the inactive level (low level) when the word line test signal WLTEST is at the high level, and sets the word line control signal WLcnt to the active level (high level) when the word line test signal WLTEST is at the low level. Specifically, the NOR circuit 156 causes (toggles) the word line control signal WLcnt repetitive transitions to the low level and the high level in synchronization with (and in reverse phase to) the internal clock signal ICK.

In this manner, the word line control signal WLcnt, which alternately repeats the low level and the high level, is supplied to the row decoder 18 along with the internal row address signal X_add.

The row decoder 18 selects the word line specified by the internal row address signal X_add, and controls the selected word line in synchronization with the word line control signal WLcnt. Specifically, when the word line control signal WLcnt is at the active level, the row decoder 18 sets the selected word line WL to the high level, which is the active level, and when the word line control signal WLcnt is at the inactive level, the row decoder 18 sets the selected word line WL to the low level, which is the inactive level. This causes (toggles) the selected word line WL repetitive transitions to the active level and the inactive level in accordance with the internal clock signal ICK. Note that, during this time, the row operation control signal/RAS maintains the active level, and hence the plurality of activated sense amplifier circuits maintain the active state independently of the state (active state/inactive state) of the selected word line.

Next, when a combination of control signals representing the test mode reset code TM_Reset are input to the control signal terminals, the C/A decoder 12 transfers the mode register set command MRS and the test mode reset code TM_Reset to the MRS/TMRS 13. The MRS/TMRS 13 causes, in response to the mode register set command MRS and the test mode reset code TM_Reset, which are supplied from the C/A decoder 12, the test signal TM a transition from the active level (high level) to the inactive level (low level).

The row control circuit 15 fixes, in response to the transition of the test signal TM to the inactive level, the word line control signal WLcnt to the inactive level.

To be specific, the switching circuit 152 of the row control circuit 15 becomes the conductive state in the period in which the internal clock signal ICK is at high level, and supplies the test signal TM at the inactive level to the latch circuit 153. The latch circuit 153 latches (holds) the supplied test signal TM at the inactive level.

When the test signal TM at the inactive level is latched by the latch circuit 153, the NAND circuit 154 fixes its output, that is, the word line test signal WLTEST to the inactive level (high level) regardless of the logical level of the internal clock signal ICK. As a result, the word line control signal WLcnt supplied from the NOR circuit 156 to the row decoder 18 is fixed to the inactive level.

Thereafter, when a combination of control signals representing the precharge command PRE are input to the control signal terminals, the C/A decoder 12 supplies the precharge command PRE to the control circuit 14. The control circuit 14 causes, in response to the precharge command PRE, the row operation control signal/RAS a transition from the active level (low level) to the inactive level (high level).

In response to the transition of the row operation control signal/RAS to the inactive level, the row control circuit 15 drives the word line WL, which has been selected, from the active state (high level) to the inactive state (low level) through the row decoder 18.

In addition, in the row control circuit 15, in response to the transition of the row operation control signal/RAS to the inactive level, the latch circuit 153 becomes a state to disable input (disabled state).

Also in the sense amplifier 19, in response to the transition of the row operation control signal/RAS to the inactive level, the plurality of sense amplifier circuits, which have been activated, are deactivated.

As described above, in the semiconductor device according to this embodiment, in performing the disturb test, while the alternate transitions between the high level and the low level are caused to the level of one word line (during a disturb period), the relevant sense amplifier circuits are maintained in the active state. This eliminates the need for the operation of the bit-line equalizing/precharging circuit, and hence reduction in power consumption and test time can be realized.

Note that, in the above description, there has been described the case where the alternate transitions between the active level and the inactive level are caused to the one word line, but it is also possible to cause a plurality of word lines the alternate transition between the active level and the inactive level at the same time.

Figure 4:
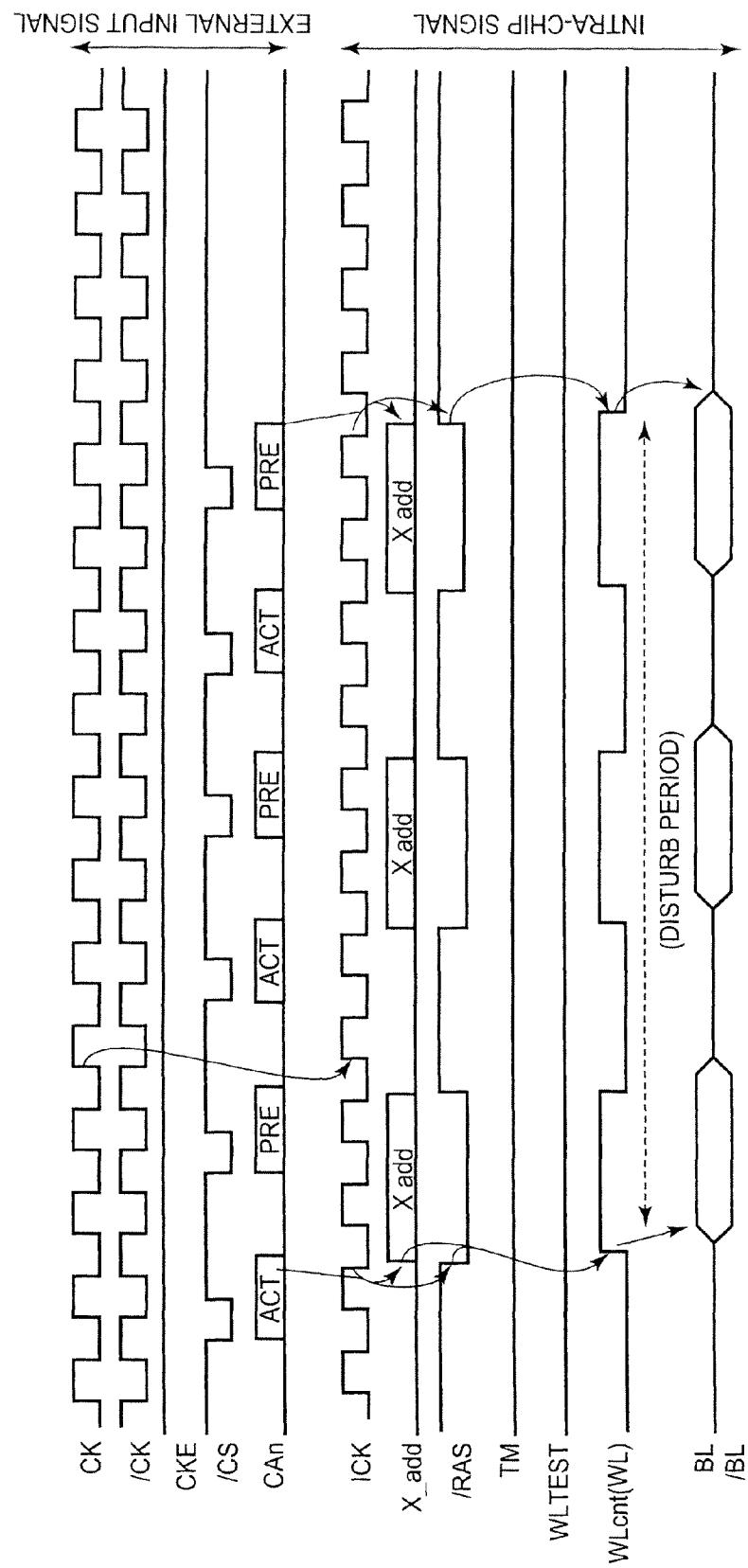
FIG. 4 is a waveform diagram for describing a normal operation of the semiconductor device of FIG. 1.

Next referring to FIG. 4, the normal operation of the semiconductor device 10 is described.

When a combination of control signals representing the activation command ACT and the internal row address signal X_add for specifying a word line WL to be accessed are input from the control signal terminals, the C/A decoder 12 supplies the activation command ACT to the control circuit 14 and also supplies the internal row address signal X_add to the row control circuit 15.

The control circuit 14 causes, in response to the activation command ACT, the row operation control signal/RAS a transition from the inactive level (high level) to the active level (low level). The internal row address signal X_add is held in the X address buffer circuit 157 of the row control circuit 15.

The row control circuit 15 drives, in response to the transition of the row operation control signal/RAS to the activated level, the word line WL specified by the internal row address signal X_add held in the X address buffer circuit 157 selectively from the inactive state (low level) to the active state (high level) through the row decoder 18.

In response to the row operation control signal/RAS having been activated, a plurality of sense amplifier circuits relevant to the word line WL that is selectively driven in the sense amplifier 19 are also activated. In other words, the plurality of sense amplifier circuits connected to the bit lines, which are connected to the memory cells connected to the selectively driven word line, are activated. As a result, potentials on the relevant bit lines BL and/BL are amplified. Then, the read operation or the write operation (not shown) is executed.

After that, when the combination of control signals representing the precharge command PRE are input from the control signal terminals, the C/A decoder 12 supplies the precharge command PRE to the control circuit 14.

The control circuit 14 causes, in response to the precharge command PRE, the row operation control signal/RAS a transition from the active level (low level) to the inactive level (high level).

The row control circuit 15 drives, in response to the transition of the row operation control signal/RAS to the inactive level, the word line WL, which has been selected, from the active state (high level) to the inactive state (low level) through the row decoder 18.

Also in response to the transition of the row operation control signal/RAS to the inactive level, the plurality of sense amplifier circuits, which have been activated, are deactivated.

In this manner, in the normal operation, in synchronization with the switching between the active state and the inactive state of the word line WL, the switching between the active state and the inactive state of the relevant sense amplifier circuits is performed. In the related semiconductor device, similar operation is performed also in the disturb test. In that case, the range indicated by the double-headed arrow with the broken line in FIG. 4 corresponds to the disturb period.

In the semiconductor device 10 according to this embodiment, as described above, when the test signal TM is at the active level, that is, when the disturb test is being executed, the sense amplifier circuits are maintained at the active state independently of the switching between the active state and the inactive state of the word line. When the test signal TM is at the inactive level, that is, when the normal operation is being executed, the switching between the active state and the inactive state of the word line WL and the switching between the active state and the inactive state of the sense amplifier circuits are executed in synchronization.

Next, a semiconductor device according to a second embodiment of this invention is described in detail.

Figure 5:
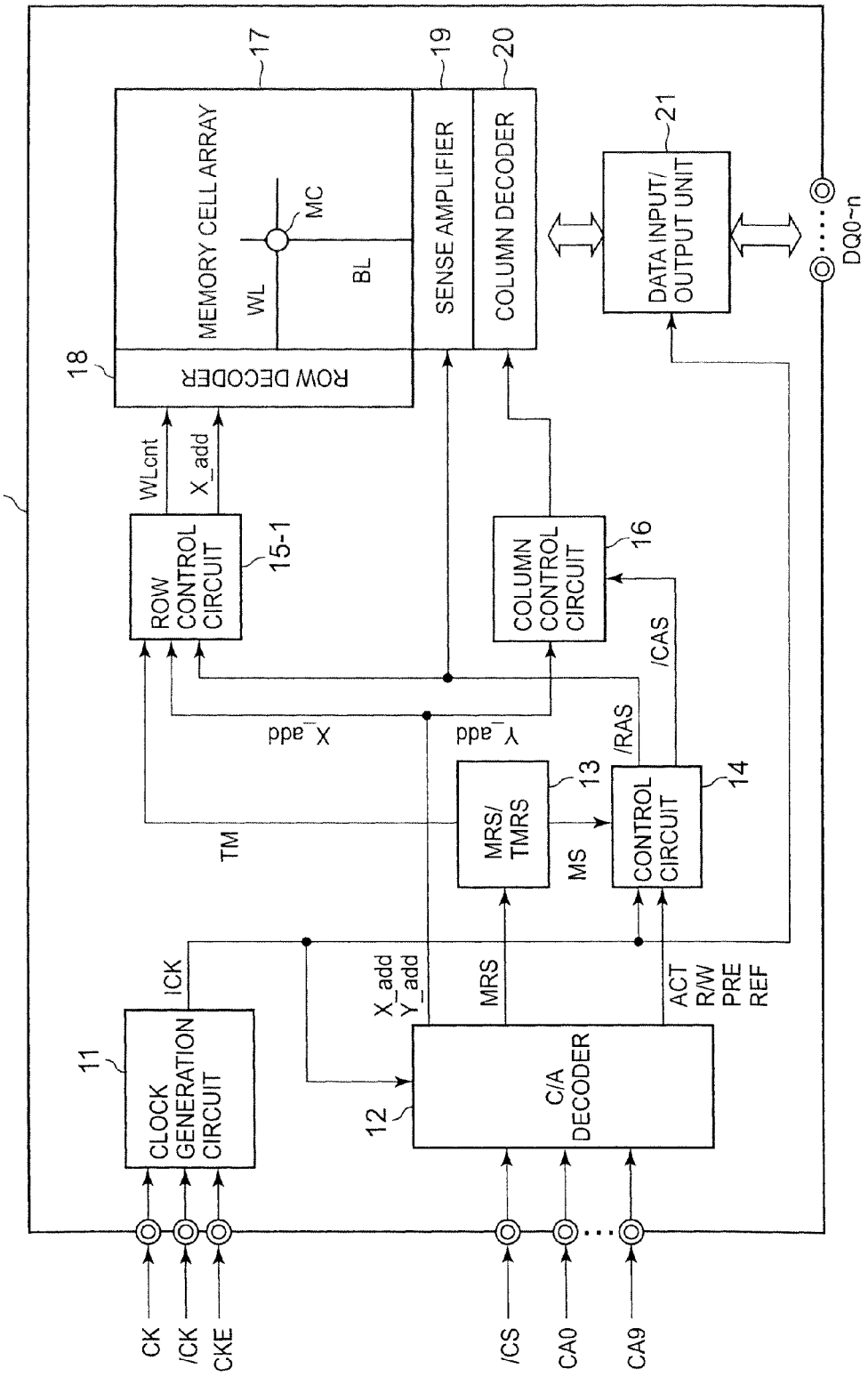
FIG. 5 is a block diagram illustrating a schematic configuration of a semiconductor device according to a second embodiment of this invention.

FIG. 5 is a block diagram illustrating a schematic configuration of a semiconductor device 10-1 according to the second embodiment of this invention.

The difference between the semiconductor device 10-1 and the semiconductor device 10 according to the first embodiment is that the internal clock signal ICK from the clock generation circuit 11 is not supplied to a row control circuit 15-1.

In the semiconductor device 10 according to the first embodiment, the control of the word line during the disturb period is performed using the internal clock signal ICK. In contrast, in this embodiment, the test mode signal TM is used to control the word line. In other words, as described below, the level of the test mode signal TM is alternately changed between the high level and the low level, to thereby control the word line.

Figure 6:
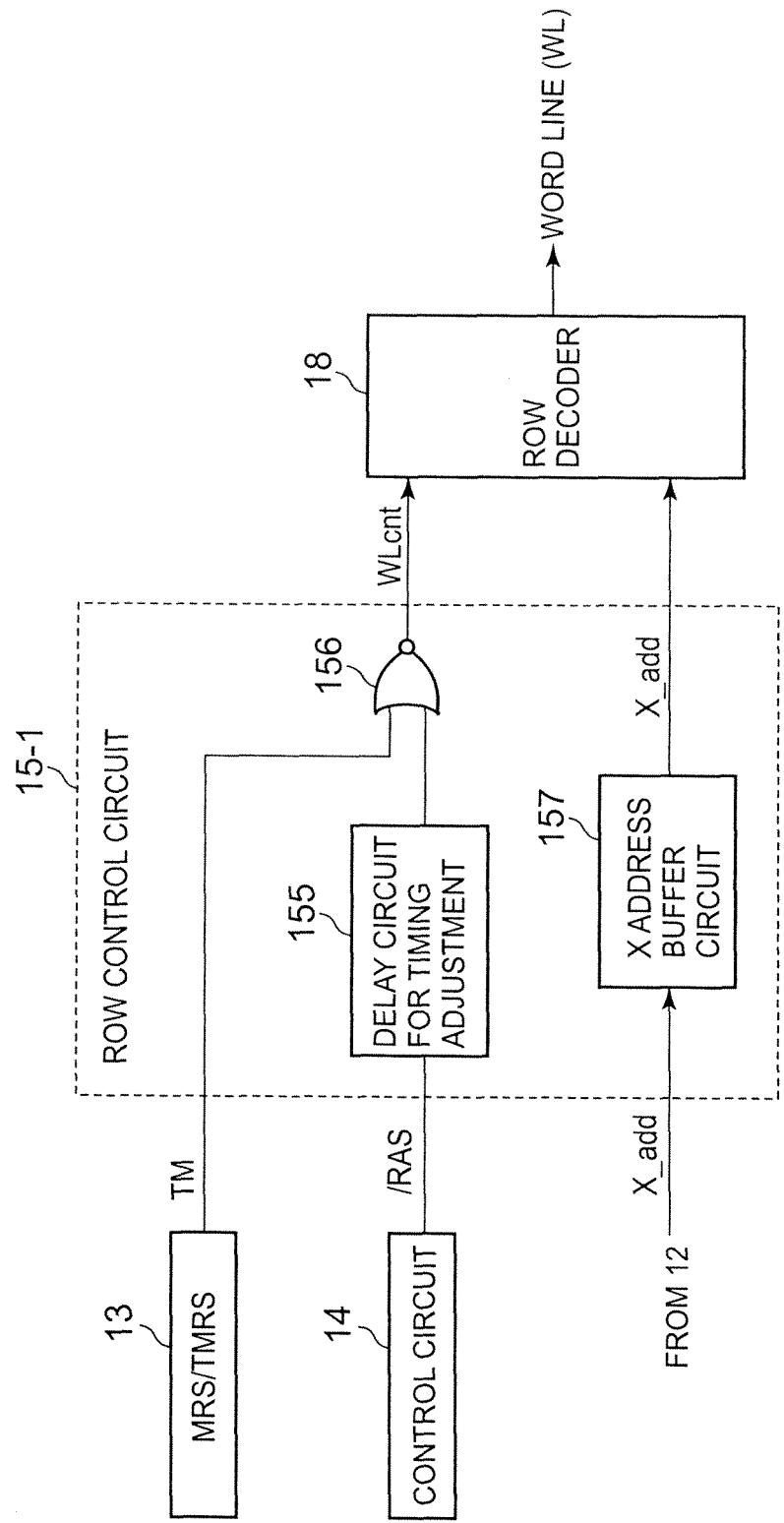
FIG. 6 is a circuit configuration diagram illustrating an internal schematic configuration of a row control circuit included in the semiconductor device of FIG. 5.

The row control circuit 15-1 is configured as illustrated in FIG. 6, for example. Specifically, the row control circuit 15-1 includes the delay circuit for timing adjustment 155, the NOR circuit 156, and the X address buffer circuit 157. As understood from the comparison with FIG. 2, in this embodiment, the configuration of the row control circuit 15-1 may be significantly simplified compared to the first embodiment.

In the row control circuit 15-1, the test mode signal TM is supplied to one input node of the NOR circuit 156, and the row operation control signal/RAS from the delay circuit for timing adjustment 155 is supplied to the other input node. The NOR circuit 156 outputs, when the row operation control signal/RAS is at the active level (low level), a signal obtained by logically inverting the test mode signal TM as the word line control signal WLcnt. By causing the level of the test mode signal TM alternate transitions between the low level and the high level, alternate transitions between the high level and the low level are caused to the level of the word line control signal WLcnt. With this, as in the first embodiment, the word line may be controlled to cause the alternate transitions between the active state and the inactive state during the disturb period.

Next referring to FIG. 7, an operation of the semiconductor device 10-1 is described.

When a combination of control signals representing the activation command ACT and the internal row address signal X_add are input to the control signal terminals, the C/A decoder 12 supplies the activation command ACT to the control circuit 14 and also supplies the internal row address signal X_add to the row control circuit 15-1.

The control circuit 14 causes, in response to the activation command ACT, the row operation control signal/RAS, which is to be supplied to the row control circuit 15-1 and the sense amplifier 19, a transition from the inactive level (high level) to the active level (low level).

The row control circuit 15-1 causes, in response to the transition of the row operation control signal/RAS to the active level, the word line control signal WLcnt a transition from the inactive level to the active level to set the word line specified by the internal row address signal X_add to the active level.

In addition, the sense amplifier 19 activates, in response to the transition of the row operation control signal/RAS to the active level, a plurality of sense amplifier circuits connected to bit lines, which are connected to memory cells connected to the word line specified by the internal row address signal X_add. The activated state of the sense amplifier circuits is maintained while the row operation control signal/RAS maintains the active level.

Then, when a combination of control signals representing the test mode set code TM_Set are input to the control signal terminals, the C/A decoder 12 instructs the MRS/TMRS 13 to set the test mode in the mode register set command MRS.

When the test mode set code TM_Set is received in the mode register set command MRS from the C/A decoder 12, the MRS/TMRS 13 causes the test mode signal TM a transition from the inactive level to the active level.

Alternatively, when a combination of control signals representing the test mode reset code TM_Reset are input to the control signal terminals, the C/A decoder 12 instructs the MRS/TMRS 13 to reset the test mode in the mode register set command MRS.

When the test mode reset code TM_Reset is received in the mode register set command MRS from the C/A decoder 12, the MRS/TMRS 13 causes the test mode signal TM a transition from the active level to the inactive level.

The test mode signal TM is supplied to one input node of the NOR circuit 156 of the row control circuit 15-1 to cause the level of the word line control signal WLcnt transitions between the low level and the high level. In other words, when the test mode signal TM is at the active level, the word line control signal WLcnt is set to the low level, and when the test mode signal TM is at the inactive level, the word line control signal WLcnt is set to the high level.

After that, over a predetermined disturb period, when the combinations of control signals representing the test mode set code TM_Set and the test mode reset code TM_Reset are alternately input to the control signal terminals, alternate transitions of the level of the test mode signal TM are caused between the active level and the inactive level. In response thereto, alternate transitions of the level of the word line control signal WLcnt also are caused between the low level and the high level. Note that, during this time (during the disturb period), the plurality of sense amplifier circuits, which have been activated, maintain the active state.

Next, when a combination of control signals representing the precharge command PRE are input to the control signal terminals, the C/A decoder 12 causes the row operation control signal/RAS a transition from the active level to the inactive level.

In response to the transition of the row operation control signal/RAS to the inactive level, the NOR circuit 156 of the row control circuit 15-1 sets the word line control signal WLcnt to the inactive level regardless of the level of the test mode signal TM.

In response to the transition of the row operation control signal/RAS to the inactive level, the plurality of sense amplifier circuits, which have been activated, are also deactivated.

As described above, also in the semiconductor device 10-1 according to this embodiment, in performing the disturb test, while the level of one word line is alternately changed between the high level and the low level, the relevant sense amplifier circuits are maintained at the active state. This eliminates the need for the operation of the bit-line equalizing/precharging circuit, and hence reduction in power consumption and test time can be realized.

Note that, also in this embodiment, it is possible to cause a plurality of word lines alternate transitions between the high level and the low level at the same time.

The normal operation of the semiconductor device 10-1 is similar to the semiconductor device 10 according to the first embodiment, and hence description thereof is omitted.

Hereinabove, this invention has been described by way of several preferred embodiments. However, it is apparent that the present invention is not limited to the above-mentioned embodiments, and various modifications and variations may be made thereto without departing from the scope and spirit of the invention.

What is claimed is:

1. A device, comprising:
   a first terminal which receives an external clock signal;
   a clock generation circuit which is connected to the first terminal and generates an internal clock signal based on the external clock signal;
   a plurality of word lines and a plurality of bit lines;
   a plurality of amplifier circuits which is connected to the plurality of bit lines, respectively; and
   a control unit which controls, in a test operation, at least one word line of the plurality of word lines to repeat a selected state and an unselected state in accordance with the internal clock signal during a first period, and maintains the plurality of amplifier circuits in an active state during the first period, and controls, in a normal operation, the plurality of amplifier circuits to switch between the active state and an inactive state depending on switching between the selected state and the unselected state of the at least one word line of the plurality of word lines,
   wherein the control unit performs a selection control of the plurality of word lines and an activation control of the plurality of amplifier circuits based on control signals supplied from outside.

2. The device according to claim 1, wherein the control unit is configured to:
   control the plurality of amplifier circuits to the active state in response to an activation command supplied from the outside and control the plurality of amplifier circuits to the inactive state in response to a precharge command supplied from the outside; and
   control, when a test mode set code is supplied during a period from when the activation command is supplied to when the precharge command is supplied, the at least one word line of the plurality of word lines to repeat the selected state and the unselected state in accordance with the internal clock signal until a test mode reset code is supplied.

3. The device according to claim 2, wherein the control unit comprises:
   a control circuit which outputs a row operation control signal, which is set to an active level in response to the activation command and is set to an inactive level in response to the precharge command;
   a test mode register which outputs a test mode signal, which is set to an active level in response to the test mode set code and is set to an inactive level in response to the test mode reset code; and
   a row control circuit which outputs a word line control signal for setting the at least one word line of the plurality of word lines to one of the selected state and the unselected state, and
   wherein the row control circuit outputs, when the row operation control signal is at the active level and the test mode signal is at the active level, a signal obtained by logically inverting the internal clock signal as the word line control signal.

4. The device according to claim 3, wherein the row control circuit comprises:
   a switching circuit which passes or blocks the test mode signal in accordance with the internal clock signal;
   a latch circuit which latches a level of the test mode signal, which has passed through the switching circuit;
   a NAND circuit which causes, when the test mode signal latched by the latch circuit is at the active level, a level of a word line test signal alternate transitions between a low level and a high level in accordance with the internal clock signal;
   a delay circuit for timing adjustment which delays the row operation control signal by a predetermined time period; and
   a NOR circuit which outputs, when the row operation control signal adjusted in timing by the delay circuit for timing adjustment is at the active level, the word line test signal as the word line control signal.

5. The device according to claim 1, wherein the control unit is configured to:
   control the plurality of amplifier circuits to the active state in response to an activation command supplied from the outside, and control the plurality of amplifier circuits to the inactive state in response to a precharge command supplied from the outside; and
   control, during a period from when the activation command is supplied to when the precharge command is supplied, the at least one word line of the plurality of word lines to repeat the selected state and the unselected state in response to a test mode set code and a test mode reset code, which are repetitively supplied from the outside.

6. The device according to claim 5, wherein the control unit comprises:
   a control circuit which outputs a row operation control signal, which is set to an active level in response to the activation command and is set to an inactive level in response to the precharge command;
   a test mode register which outputs a test mode signal, which is set to an active level in response to the test mode set code and is set to an inactive level in response to the test mode reset code; and
   a row control circuit which outputs a word line control signal for setting the at least one word line of the plurality of word lines to one of the selected state and the unselected state, and
   wherein the row control circuit outputs, when the row operation control signal is at the active level, a signal obtained by logically inverting the test mode signal as the word line control signal.

7. The device according to claim 6, further comprising:
   a delay circuit for timing adjustment which delays the row operation control signal by a predetermined time period; and
   a NOR circuit which outputs, when the row operation control signal adjusted in timing by the delay circuit for timing adjustment is at the active level, a signal obtained by logically inverting the test mode signal as the word line control signal.

8. A device, comprising:
   a memory cell array comprising a plurality of word lines and a plurality of bit lines;

an amplifier unit connected to the plurality of bit lines; and
a control unit which performs selection control of the plurality of word lines and activation control of the amplifier unit,
wherein the control unit causes, in a first period of a test operation, at least one word line of the plurality of word lines to alternately change to a selected state and an unselected state and maintains the amplifier unit to an active state,
wherein the control unit performs the selection control of the plurality of word lines and the activation control of the amplifier unit based on a control signal supplied from outside.

9. The device according to claim 8, wherein the control unit is configured to:
activate the amplifier unit in response to an activation command, which is supplied as the control signal;
deactivate the amplifier unit in response to a precharge command, which is supplied as the control signal; and
alternately change, in response to a test mode related control signal, which is supplied as the control signal during a period from when the activation command is supplied to when the precharge command is supplied, the at least one word line of the plurality of word lines to the selected state and the unselected state.

10. The device according to claim 9, wherein the control unit alternately changes, from when a test mode set code is supplied as the test mode related control signal to when a test mode reset code is supplied as the test mode related control signal, the at least one word line of the plurality of word lines to the selected state and the unselected state in accordance with an internal clock signal.

11. The device according to claim 9, wherein the control unit alternately changes, in response to a test mode set code and a test mode reset code, which are repetitively supplied as the test mode related control signal, the at least one word line of the plurality of word lines to the selected state and the unselected state.

* * * * *